United States Patent
DeHon et al.

(10) Patent No.: US 7,500,213 B2
(45) Date of Patent: Mar. 3, 2009

(54) ARRAY-BASED ARCHITECTURE FOR MOLECULAR ELECTRONICS

(75) Inventors: André DeHon, Pasadena, CA (US); Charles M. Lieber, Lexington, MA (US)

(73) Assignees: California Institute of Technology, Pasadena, CA (US); President and Fellows of Harvard College, Cambridge, MA (US)

( * ) Notice: Subject to any disclaimer, the term of this patent is extended or adjusted under 35 U.S.C. 154(b) by 454 days.

(21) Appl. No.: 11/344,884

(22) Filed: Jan. 31, 2006

(65) Prior Publication Data

US 2006/0161876 A1    Jul. 20, 2006

Related U.S. Application Data

(62) Division of application No. 10/347,121, filed on Jan. 17, 2003, now Pat. No. 7,073,157.

(60) Provisional application No. 60/349,561, filed on Jan. 18, 2002.

(51) Int. Cl.
*G06F 17/50* (2006.01)
(52) U.S. Cl. ............................................. 716/17
(58) Field of Classification Search .................. 716/16, 716/17
See application file for complete search history.

(56) References Cited

U.S. PATENT DOCUMENTS

| | | | |
|---|---|---|---|
| 5,349,558 A | 9/1994 | Cleveland et al. | 365/200 |
| 6,128,214 A | 10/2000 | Kuekes et al. | 364/151 |
| 6,256,767 B1 | 7/2001 | Kuekes et al. | 716/9 |
| 6,314,019 B1 | 11/2001 | Kuekes et al. | 365/151 |
| 6,383,784 B1 | 5/2002 | Smith | 435/91.2 |
| 6,473,351 B2 | 10/2002 | Tomanek et al. | 365/215 |
| 6,777,982 B2 | 8/2004 | Goldstein et al. | 326/134 |
| 6,900,479 B2 | 5/2005 | DeHon et al. | 257/202 |
| 6,963,077 B2 | 11/2005 | DeHon et al. | 257/9 |
| 2002/0027819 A1 | 3/2002 | Tomanek et al. | 365/215 |
| 2002/0175390 A1 | 11/2002 | Goldstein et al. | 257/481 |
| 2003/0089899 A1 | 5/2003 | Lieber et al. | 257/9 |
| 2003/0200521 A1 | 10/2003 | DeHon et al. | 716/16 |
| 2003/0206436 A1 | 11/2003 | Eaton, Jr. et al. | 365/177 |

(Continued)

FOREIGN PATENT DOCUMENTS

WO    02/103753 A2    12/2002

(Continued)

OTHER PUBLICATIONS

U.S. Appl. No. 10/853,907, filed May 25, 2004, DeHon et al.

(Continued)

*Primary Examiner*—Jack Chiang
*Assistant Examiner*—Brandon W Bowers
(74) *Attorney, Agent, or Firm*—Steinfl & Bruno

(57) ABSTRACT

An architecture for nanoscale electronics is disclosed. The architecture comprises arrays of crossed nanoscale wires having selectively programmable crosspoints. Nanoscale wires of one array are shared by other arrays, thus providing signal propagation between the arrays. Nanoscale signal restoration elements are also provided, allowing an output of a first array to be used as an input to a second array. Signal restoration occurs without routing of the signal to non-nanoscale wires.

4 Claims, 9 Drawing Sheets

U.S. PATENT DOCUMENTS

| | | | |
|---|---|---|---|
| 2004/0113138 A1 | 6/2004 | DeHon et al. | 257/9 |
| 2004/0113139 A1 | 6/2004 | DeHon et al. | 257/9 |
| 2005/0017234 A1 | 1/2005 | DeHon et al. | 257/9 |

FOREIGN PATENT DOCUMENTS

| | | |
|---|---|---|
| WO | 03/063208 A2 | 7/2003 |
| WO | 2004/061859 A2 | 4/2004 |
| WO | 2004/034467 A2 | 7/2004 |

OTHER PUBLICATIONS

U.S. Appl. No. 10/925,863, filed Aug. 24, 2004, DeHon.

Albrecht, O., et al., "Construction and Use of LB Deposition Machines for Pilot Production," *Thin Solid Films*, vol. 284-285, pp. 152-156 (Sep. 15, 1996).

Björk, M.T., et al., "One-Dimensional Steeplechase for Electrons Realized," *Nano Letters*, vol. 2, No. 2, pp. 87-89 (2002).

Brown, C.L., et al., "Introduction of [2]Catenanes Into Langmuir Films and Langmuir-Blodgett Multilayers. A Possible Strategy for Molecular Information Storage Materials," *Langmuir*, vol. 16, No. 4, pp. 1924-1930 (2000).

Chen, Y., et al., "Nanoscale Molecular-Switch Crossbar Circuits," *Institute of Physics Publishing*, Nanotechnology 14, pp. 462-468 (2003).

Chen, Y., et al., "Self-Assembled Growth of Epitaxial Erbium Disilicide Nanowires on Silicon (001)," *Applied Physics Letters*, vol. 76, No. 26, pp. 4004-4006 (Jun. 26, 2000).

Chou, S.Y., et al., "Sub-10 nm Imprint Lithography and Applications," *J. Vac. Sci. Technol. B*, vol. 15, No. 6, pp. 2897-2904 (Nov./Dec. 1997).

Collier, C.P., et al., "A [2]Catenane-Based Solid State Electronically Reconfigurable Switch," *Science*, vol. 289, pp. 1172-1175 (Aug. 18, 2000).

Collier, C.P., et al., "Electronically Configurable Molecular-Based Logic Gates," *Science*, vol. 285, pp. 391-394 (Jul. 16, 1999).

Cui, Y., et al., "Diameter-Controlled Synthesis of Single-Crystal Silicon Nanowires," *Applied Physics Letters*, vol. 78, No. 15, pp. 2214-2216 (Apr. 9, 2001).

Cui, Y., et al., "Doping and Electrical Transport in Silicon Nanowires," *The Journal of Physical Chemistry B*, vol. 104, No. 22, pp. 5213-5216 (Jun. 8, 2000).

Cui, Y., et al., "Functional Nanoscale Electronic Devices Assembled Using Silicon Nanowire Building Blocks," *Science*, vol. 291, pp. 851-853 (Feb. 2, 2001).

DeHon, A., "Array-Based Architecture for FET-Based, Nanoscale Electronics," *IEEE Transactions on Nanotechnology*, vol. 2, No. 1, pp. 23-32 (Mar. 2003).

Dekker, C., "Carbon Nanotubes as Molecular Quantum Wires," *Physics Today*, pp. 22-28 (May 1999).

Derycke, V., et al., "Carbon Nanotube Inter-and Intramolecular Logic Gates," *Nano Letters*, vol. 1, No. 9, pp. 453-456 (Sep. 2001).

Goldstain, S.C., et al., "NanoFabrics: Spatial Computing Using Molecular Electronics," *Proc. Of the 28th Annual International Symposium on Computer Architecture*, pp. 1-12 (Jun. 2001).

Gudiksen, M.S., et al., "Growth of Nanowire Superlattice Structures for Nanoscale Photonics and Electronics," *Nature*, vol. 415, pp. 617-620 (Feb. 7, 2002).

Huang, Y., et al., "Directed Assembly of One-Dimensional Nanostructures into Functional Networks," *Science*, vol. 291, pp. 630-633. (Jan. 26, 2001).

Huang, Y., et al., "Logic Gates and Computation from Assembled Nanowire Building Blocks," *Science*, vol. 294, pp. 1313-1317 (Nov. 9, 2001).

International Written Opinion for the corresponding PCT Application No. PCT/US03/01555, issued on Jun. 30, 2005 (7 pages).

Lauhon, L.J., et al., "Epitaxial Core-Shell and Core-Multishell Nanowire Heterostructures," *Nature*, vol. 420, pp. 57-61 (Nov. 7, 2002).

Lieber, C.M., "Nanowire Superlattices," *Nano Letters*, vol. 2, No. 2, pp. 81-82 (Feb. 2002).

Morales, A.M., et al., "A Laser Ablation Method for the Synthesis of Crystalline Semiconductor Nanowires," *Science*, vol. 279 pp. 208-211 (Jan. 9, 1998).

Tans, S.J., et al., "Room-Temperature Transistor Based on a Single Carbon Nanotube," *Nature*, vol. 393, pp. 49-52 (May 7, 1998).

Ulman, A., "Part Two: Langmuir-Blodgett Films," *An Introduction to Ultrathin Organic Films*, Section 2.1, pp. 101-132 (1991).

Whang, D., et al., "Nanolithography Using Hierarchically Assembled Nanowire Masks," *Nano Letters*, vol. 3, No. 7, pp. 951-954 (2003).

Wu, Y., et al., "Block-by-Block Growth of Single-Crystaline Si/SiGe Superlattice Nanowires," *Nano Letters*, vol. 2, No. 2, pp. 83-86 (2002).

DeHon, A., "Array Based Architecture for FET-Based Nanoscale Electronics", IEEE Transactions on Nanotechnology, vol. 2, No. 1, pp. 23-32(Mar. 2003).

Ziegler, M. M., et al., "CMOS/NANO Co-Design for Crossbar-based Molecular Electronics Systems" *IEEE Transactions on Nanotechnology*, vol. 2, No. 4, pp. 217-230 (Dec. 4, 2004).

ARRAY-BASED ARCHITECTURE FOR MOLECULAR ELECTRONICS

CROSS REFERENCE TO RELATED APPLICATIONS

This patent application is a divisional application of U.S. application Ser. No. 10/347,121, filed Jan. 17, 2003, now U.S. Pat. No. 7,073,157 which application claims the benefit of U.S. provisional Patent Application Ser. No. 60/349,561, filed Jan. 18, 2002 for a "Regular architecture for bootstrapping and operation of a universal, molecular-scale computing array" by André DeHon and Charles Lieber, the disclosure of which is incorporated herein by reference. This application may also be related by subject matter to the following U.S. Patent Applications: U.S. patent application Ser. No. 10/627,405, filed on Jul. 24, 2003 (issued as U.S. Pat. No. 6,900,479); U.S. patent application Ser. No. 10/627,406, filed Jul. 24, 2003 (issued as U.S. Pat. No. 6,963,077); U.S. patent application Ser. No. 10/853,907, filed May 25, 2004; U.S. patent application Ser. No. 10/856,115, filed May 28, 2004 (published as U.S. Patent Application Publication No. 2005/0017234); and U.S. patent application Ser. No. 10/925,863, filed Aug. 24, 2004.

STATEMENT REGARDING FEDERALLY SPONSORED RESEARCH OR DEVELOPMENT

The present invention was made with support from the United States Government under Grant number N00014-01-0651 awarded by the Office of Naval Research of the Department of the Navy. The United States Government has certain rights in the invention.

BACKGROUND OF THE INVENTION

1. Field of the Invention

The present invention relates to the field of sublithographic fabrication of electronic circuits, in particular molecular electronics. More specifically, an array-based architecture is disclosed using a collection of techniques where small feature sizes are realized without lithographic processing. The arrays may be configured post-fabrication to implement any computable function of some finite size determined by the size of the arrays.

2. Description of the Prior Art

Today carbon nanotubes which are nanometers in diameter and microns long can be synthesized. See, for example, Cees Dekker, Carbon nanotubes as molecular quantum wires, Physics Today, pp. 22-28, May 1999. The growth and alignment of these nanotubes can be controlled, such that the nanotubes can be assembled into parallel rows of conductors and layered into arrays. See, for example, Yu Huang, Xiangfeng Duan, Qingqiao Wei, and Charles M. Lieber, Directed assembly of one-dimensional nanostructures into functional networks. Ultimately, the nanotubes can be a single nanometer wide and spaced several nanometers apart.

At the same time, technologies to grow silicon nanowires are being developed. See, for example, Yi Cui, Lincoln J. Lauhon, Mark S. Gudiksen, Jianfang Wang, and Charles M. Lieber, Diameter-controlled synthesis of single crystal silicon nanowires, Applied Physics Letters, 78(15):2214-2216, 2001, and Alfredo M. Morales and Charles M. Lieber, A laser ablation method for synthesis of crystalline semiconductor nanowires, Science, 279:208-211, 1998. Also the silicon nanowires are only nanometers in width and can be grown or assembled into sets of long parallel wires. See, for example, Yong Chen, Douglas A. Ohlberg, Gilberto Medeiros-Ribeiro, Y. Austin Chang, and R. Stanley Williams, Self-assembled growth of epitaxial erbium disilicide nanowires on silicon (001), Applied Physics Letters, 76(26):4004-4006, 2000. The electrical properties of these silicon nanowires can be controlled with dopants, yielding semiconductor wires, as shown, for example, in Yi Cui, Xiangfeng Duan, Jiangtao Hu, and Charles M. Lieber, Doping and electrical transport in silicon nanowires, Journal of Physical Chemistry B, 104(22): 5213 5216, Jun. 8, 2000.

It is also known how to build nanoscale crosspoints. FIG. 1 is a schematic cross-sectional view which shows a suspended prior art nanotube conductor 1 coupled to a plurality of lower carbon nanotube or silicon nanowire conductors 2, 3, and 4 through a plurality of supports 5. The supports are made of a dielectric material, such as silicon dioxide. In this way, a nanotube-nanotube (or nanotube-nanowire) junction is formed. The junction is bistable with an energy barrier between the two states. In one state, see tubes 1-2 and 1-4, the tubes are "far" apart and mechanical forces keep the top wire 1 from descending to the lower wire 2, 4. At this distance the tunneling current between the crossed conductors is small, resulting, effectively, in a very high resistance (GigaOhms) between the conductors. In the second state, see tubes 1-3, the tubes come into contact and are held together via molecular forces. In this state, there is little resistance (about 100 K$\Omega$) between the tubes. Therefore, by applying a voltage to the tubes, one can charge them to the same or opposite polarities and use electrical charge attraction/repulsion to cross the energy gap of the junction between the two bi-stable states, effectively setting or resetting the programming of the connection. These junctions can be rectifying such that the connected state exhibits PN-diode rectification behavior. Molecular electronics PNjunctions are disclosed, for example, in Y. Cui and C. M. Lieber, "Functional Nanoscale Electronic Devices Assembled using Silicon Nanowire Building Blocks," Science 291, 891-893 (2001).

Also known in the prior art is how doped silicon nanowires can exhibit Field-Effect Transistor (FET) behavior. FIG. 2 is a schematic perspective view of a prior art embodiment which shows oxide 10 grown over a silicon nanowire 11 to prevent direct electrical contact of a crossed conductor 12, for example a carbon nanotube or a silicon nanowire. The electrical field of one wire can then be used to "gate" the other wire, locally evacuating a region of the doped silicon nanowire of carriers to prevent conduction. FET resistance varies from Ohms to GigaOhms. Similarly, also carbon nanotubes can exhibit FET behavior. See, for example, Yu Huang, Xiangfeng Duan, Yi Cui, Lincoln Lauhon, Kevin Kim and Charles M. Lieber, "Logic Gates and Computation from Assembled Nanowire Building Blocks," Science, 2001, v294, p1313-1317, V. Derycke, R. Martel, J. Appenzeller and Ph. Avouris, "Carbon Nanotube Inter- and Intramolecular Logic Gates," Nano Letters, 2001, v1n9, p435-456, and Sander J. Trans, Alwin R. M. Verschueren and Cees Dekker, "Room-temperature Transistor Based on a Single Carbon Nanotube," Nature, 1998, v393, p49-51, May 7.

Furthermore, regular arrangements of nanoscale wires (parallel arrays of wires, crossed, orthogonal structures) are also known. A crossbar is usually defined as an array of switches that connect each wire in one set of parallel wires to every member of a second set of parallel wires that intersects the first set. Generally, the two sets of wires are perpendicular to each other. An interesting consequence of all these devices is the ability to store state and implement switching at a wire crossing. That is, the switch device itself holds its state. Therefore, crossbars in this technology can be fully populated with no cost in density. This is particularly beneficial in achieving the necessary defect tolerance. See, for example, U.S. Pat. No. 6,256,767 to Kuekes and Williams.

The prior art also discloses how to build a wide range of electronic circuits where features at the scale of the device features (e.g. VLSI) can precisely be placed. Additionally, techniques for building universally programmable devices (e.g. PALs, PLAs, connections thereof) having VLSI fabrication capabilities are also known.

Recently, it is also known how to build small collections of non-restoring molecular scale logic and how to connect together non-restoring molecular scale logic at the microscale. See, for example, C. P. Collier, E. M. Wong, M. Belohradsky, F. M. Raymo, J. F. Stoddard, P. J. Kuekes, R. S. Williams, and J. R. Heath, "Electronically configurable molecular-based logic gates," Science, vol. 285, pp. 391-394, 1999.

Also known is an architecture based on molecular-scale electronic building blocks, called 'nanoFabrics.' See Seth Copen Goldstein and Mihai Budiu, "Nanofabrics: Spatial computing using molecular electronics," in Proceedings of the 28$^{th}$ Annual International Symposium on Computer Architecture, June 2001, pp. 178-189. However, the architecture disclosed in Goldstein is restricted to the use of two-terminal devices only and does not teach how nanoBlocks are customized.

It is still not known how to connect together large numbers of these nanoscale or sublithographic devices to create arbitrary logic functions. Additionally, it is still not known how to arrange for arbitrary connection of (cascading of) logic circuits at the nanoscale level without need for returning to a micro-scale level for signal restoration. It is also not known how to exploit the limited assembly techniques now possible to build arbitrary logic functions. It is also not known which logic structures are efficient when dealing with the cost constraints imposed by these fabrication techniques.

Throughout the present disclosure, the term micron-scale will refer to dimensions that range from about 0.1 micrometer to about 2 micrometers in size. The term nanometer-scale (also nanoscale) will refer to dimensions that range from 0.1 nanometers to 50 nanometers (0.05 micrometer), the preferred range being from 0.5 nanometers to 5 nanometers.

SUMMARY OF THE INVENTION

The present invention provides an architecture for molecular electronics based on carbon nanotubes and silicon nanowires. The architecture is based on a collection of interconnected arrays. The crossed arrays can act as memory elements (memory cores), computational elements (PLAs) and interconnecting elements (wires and crossbars). Further, the architecture according to the invention allows sparing and remapping to avoid defects in a base array. While a single, monolithic memory, PLA, or crossbar would not be useful or efficient, a collection of interconnected arrays as shown in the present invention will allow to both exploit logical structure and isolate faults.

According to a first aspect, an architecture for nanoscale electronics is provided, the architecture comprising: arrays of crossed nanoscale wires, each array comprising a plurality of crosspoints between nanoscale wires, the crosspoints being selectively programmable, wherein nanoscale wires of one array are shared by other arrays, thus providing signal propagation between the one array and the other arrays; and nanoscale signal restoration elements, allowing an output of a first array to be used as an input to a second array, wherein signal restoration occurs without routing of the signal to non-nanoscale wires.

According to a second aspect, a circuit is provided, comprising: a plurality of arrays having first and second sets of address lines and connections between the first and second sets of address lines; and a plurality of driving devices for the plurality of arrays, the driving devices having third and fourth sets of address lines and connections between the third and fourth sets of address lines, wherein the driving devices have a first condition in which they act as decoders for the arrays, and a second condition in which they act as signal restoring devices for the arrays.

According to a third aspect, a method of driving a plurality of arrays having first and second sets of address lines and connections between the first and second sets of address lines is provided, the method comprising: providing a plurality of driving devices for the plurality of arrays, the driving devices having third and fourth sets of address lines and connections between the third and fourth sets of address lines, the driving devices having a first condition in which the driving devices act as decoders for the arrays, and a second condition in which the driving devices act as signal restoring devices for the arrays.

According to a fourth aspect, A method for assembly of arbitrary boolean logic computations at sublithographic scales is provided, the method comprising: providing sublithographic-scale arrays performing a predetermined logic function, such as a NOR logic function; interconnecting the arrays; and customizing the arrays to perform the logic function and signal routing.

The arrays can be either diode-based or FET-based. A diode-based array is a three dimensional array comprising a matrix of elements like those disclosed in FIG. 1. A FET based array is a three-dimensional array comprising a matrix of elements like those disclosed in FIG. 2. Diode-based arrays can be alternated with FET-based arrays. Routing and signal polarity control is allowed by arrangement of overlap topologies and array inversions (e.g. OR and NOR).

The present disclosure will show in detail NOR arrays. Collections of NOR gates are universal, so this substrate is sufficient to perform any computation. Upon reading of the present disclosure, the person skilled in the art will be able to realize arrays based on a different kind of logic, e.g. NAND logic.

According to the present invention, uses and assembly techniques are advantageously disclosed to build a universal, programmable structure without requiring signals to pass back from nanoscale to microscale for signal restoration. Additionally, key elements for micro-to-nanoscale interfacing are shown.

A further advantage of the present invention is that the architecture disclosed herein can provide universal logic functionality. The architecture allows a sufficient set of capabilities for performing logic, restoration, routing, and bootstrap programming using only large, crossed wire arrays.

Additional advantages of the architecture according to the present invention are its minimalism, defect tolerance, and compatibility with emerging, bottom-up, nanoscale fabrication techniques. Furthermore, the disclosed architecture also supports micro-to nanoscale interfacing for communication with conventional integrated circuits and bootstrap loading.

BRIEF DESCRIPTION OF THE DRAWINGS

The present invention will be understood and appreciated more fully from the following detailed description taken in conjunction with the drawings in which.

DETAILED DESCRIPTION OF THE INVENTION

Basic Passive Devices

Figure 1:
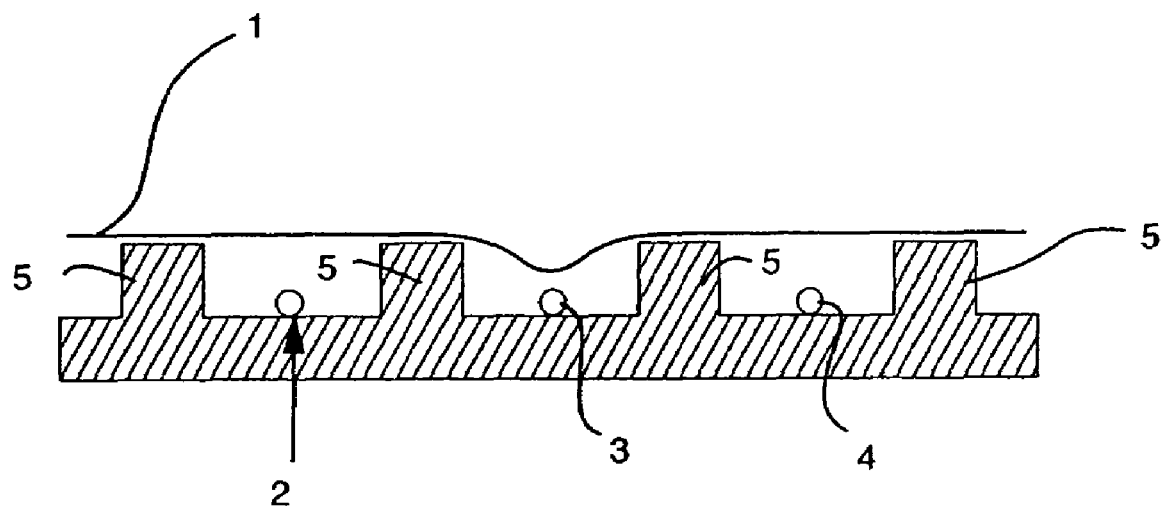
FIG. 1 shows a schematic cross-sectional view of a prior art nanotube conductor.
Figure 2:
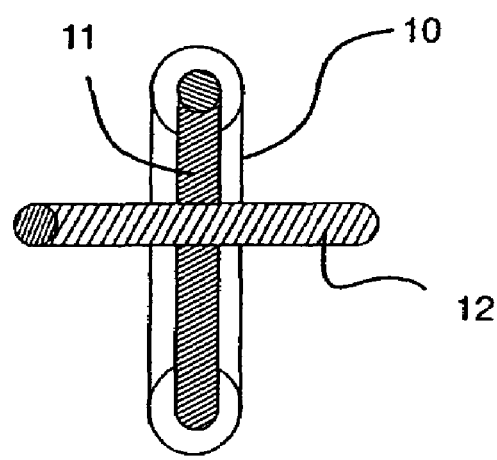
FIG. 2 shows a schematic perspective view of a prior art nanotube FET arrangement.
Figure 3:
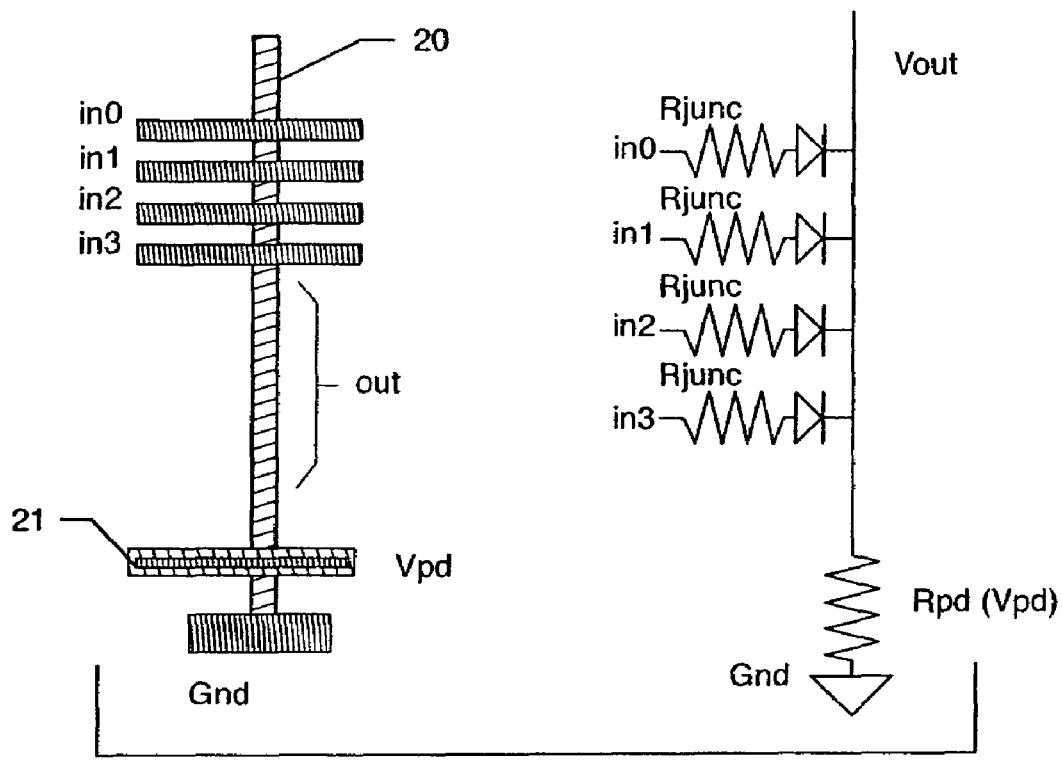
FIG. 3 shows a nanotube wired-OR connection and its electrical equivalent.

Reference is initially made to FIG. 3, the left side of which shows a nanotube wired OR logic arrangement. The right side of FIG. 3 shows the electrical equivalent of the left side arrangement. The upper nanotubes or nanowires IN0, IN1, IN2, IN3 contact the lower nanotube 20, thus forming a plurality of low resistance PN-type junctions of the kind already discussed in FIG. 1. In case an upper nanotube IN1 is "far" from the lower nanotube 20, a high impedance configuration is formed. Element 21 is a nanotube covered by oxide, which presents a FET behavior (see FIG. 2), thus producing a voltage-controlled resistance value Rpd. Element 21 acts as a static load in the wired-OR arrangement shown in the Figure.

Figure 4:
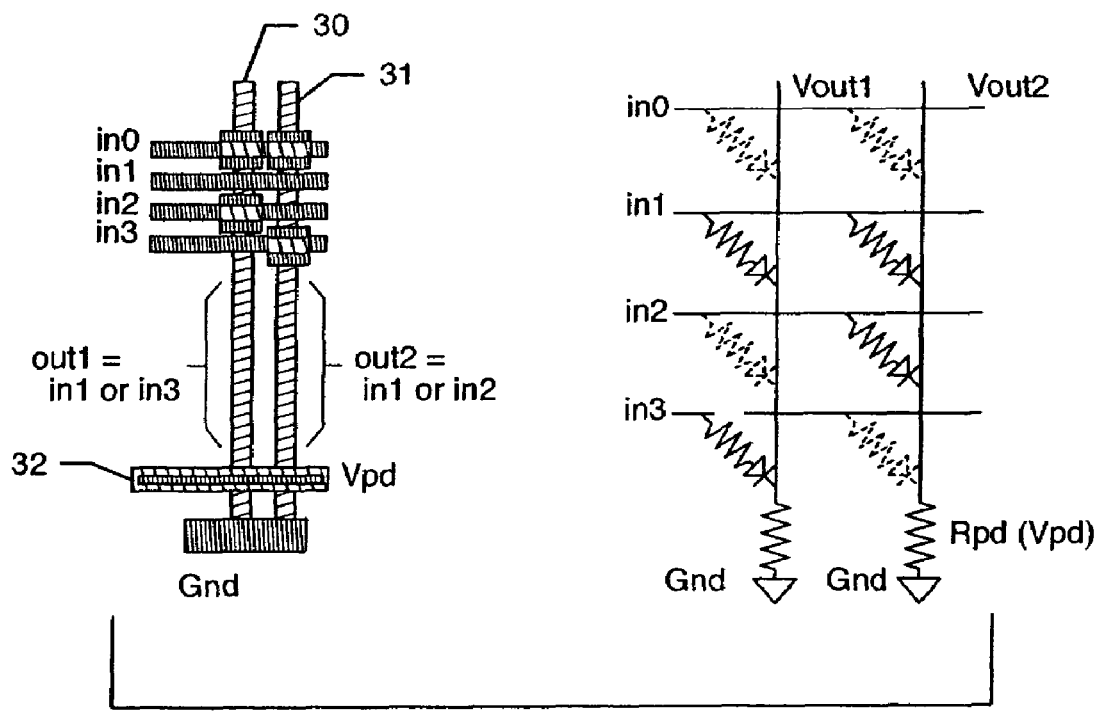
FIG. 4 shows a nanotube programmable diode OR array and its electrical equivalent.

FIG. 4 shows a programmable diode OR array. As usual, the left side shows the nanotube arrangement, and the right side shows the corresponding electrical equivalent. The black squares between upper nanotubes IN0 . . . IN3 and lower nanotubes 30, 31 indicate that the upper nanotubes are suspended in the OFF position (see, for example, nanotubes 1-2 and 1-4 in FIG. 1). Therefore, upper nanotube IN0 does not contact lower nanotubes 30, 31; upper nanotube IN1 contacts lower nanotubes 30, 31; upper nanotube IN2 does not contact lower nanotube 30 and contacts lower nanotube 31; and upper nanotube IN3 contacts lower nanotube 30 and does not contact lower nanotube 31. Element 32 is a nanotube covered by oxide, which presents a FET behavior, thus producing a voltage-controlled resistance value Rpd, and acting as a static load.

Signal Restoration

Both devices shown in FIG. 3 and FIG. 4 do not produce gain. Therefore, restoring logic performing signal restoration is needed to provide gain, either at the microscale or at the nanoscale level. Signal restoration allows high signals to be driven higher and low signals to be driven lower, in order to allow an arbitrary number of devices to be cascaded together and a logical distinction between a low logical value and a high logical value to be maintained. Therefore, signal restoration helps protecting the circuit against noise and allows arbitrary circuit composition.

According to the present invention, restoring logic is provided at the nanoscale level in order to allow the output of a first stage to be used as input for a second stage, making it possible to compute through an arbitrary number of logic stages without routing the signal to non-nanoscale (e.g., microscale) wires. In particular, FET devices of the kind shown in FIG. 2 will allow to define a restoring logic discipline at the nanoscale level. Using the FET junctions like those shown in FIG. 2, NMOS-like inverters, NAND, AND, NOR, or OR logic can be built. For clarity purposes, the present application will focus on the electrical operation of the restoring FET NOR stage using p-type silicon nanowires and a PMOS-like logic discipline. Using only NOR arrays is sufficient to achieve universal logic. The person skilled in the art will also be able to realize embodiments for n-type silicon nanowires.

Figure 5:
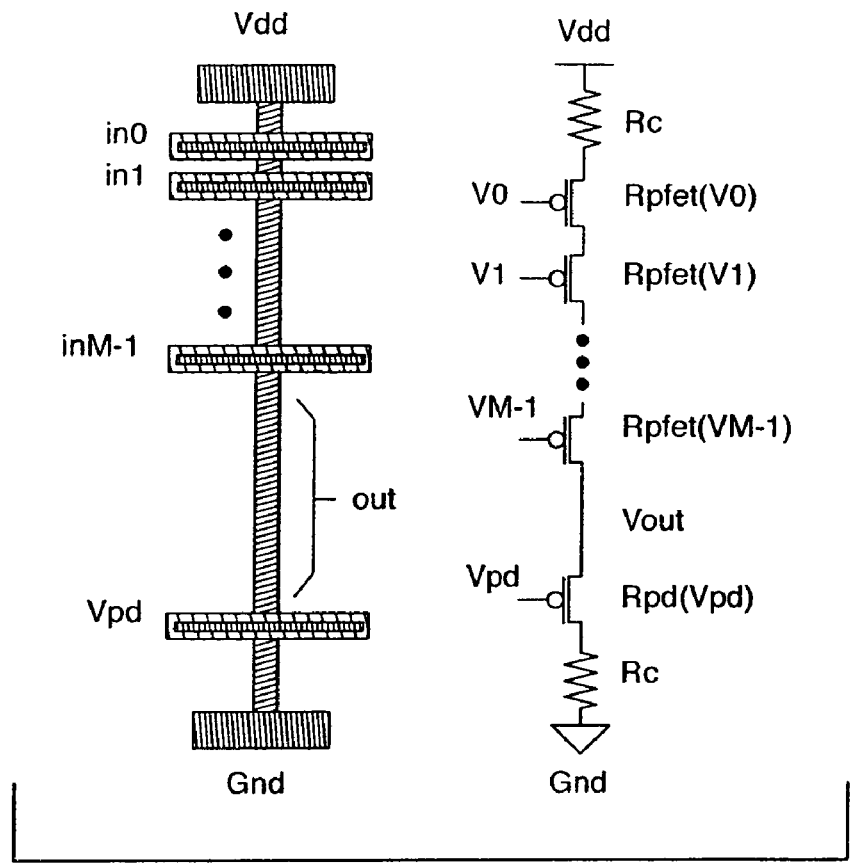
FIG. 5 shows a nanotube PFET NOR and its electrical equivalent.

FIG. 5 shows a nanotube PFET (p-type FET) NOR circuit and its electrical equivalent. In a first scenario (pull-up), all inputs IN0, . . . , INM-1 of the FETs are low. As a consequence, there is conduction through all the FETs formed at the wire crossings (no evacuation of charge). Since there is conduction through all the FETs and the top end of the series of FETs is connected to a power supply driven to a high voltage, the wire can be pulled up to the high voltage of the power supply. The output is now high. In a second scenario (pull-down), one of the inputs IN0, . . . , INM-1 is high. Ideally, there is no conduction through the portion of the wire under this FET. This breaks the path from the high voltage supply to the output region of the wire. In absence of current flow, the output cannot be pulled up to the high voltage. The static pulldown is always weakly enabled. If it is not pulling against a strong connection to the high voltage supply, as in the previous scenario, the weak static pulldown will be able to pull the output down to a low voltage level. The output of the FET is now low.

Alternatively, restoration at the nanoscale level could also be obtained by means of precharge logic structures. In the simplest case, the static pull-down in the NOR is replaced with a precharge gate. In fact, the same structure shown in FIG. 5 may serve this role as long as the pull-down gate is appropriately controlled. Alternatively, the single pull-down line could be microscale instead of nanoscale. Additionally, an additional microscale input to disable the pull-up could be added. Operation is started by driving the new pull-up line (the additional input) to a high value (disabling current flow to the power supply), and enabling the pull-down precharge line by driving it to a low value. This will allow the output to charge to a low value. After the output is charged to a low value, the pull-down is disabled. The output will remain at the low value for which it is now precharged. Subsequent to this, the new pull-up line is enabled. If all of the inputs are low, conduction is allowed to the power supply and the output can be pulled up. If one or more of the inputs are high, there is no such path and the output remains at a low voltage level. Thus, the device continues to perform its NOR function. Alternate stages will use complementary precharge phases, in order not to release the pull-up enable line while the inputs to a stage are still precharging and have not been allowed to evaluate. This domino-style logic technique is well-known per se in the prior art and will not be here explained in detail.

Bootstrapping

Once each of the crosspoints in each of the arrays is able to be programmed, the arrays are able to perform any desired logic or routing function. The personalization that allows arbitrary functions to be built is obtained through programming of the arrays. This is obtained by bootstrapping the process, i.e. by providing a starting logic which allows selective programming of the crosspoints of the arrays. In particular, a large number of lines can be controlled by a relatively minor number of control lines by means of decoders. In this way, the crosspoints forming the arrays will be programmable, by means of the nanoscale decoder, to either connect (diode) or gate (FET) the nanoscale wires forming the crosspoints. The crosspoints will be programmable to exhibit a bi-stable behavior. For example, a first state of the crosspoints could correspond to a weak conductance state and a second state of the crosspoints could correspond to a strong conductance state between the nanoscale wires forming the crosspoints. Alternatively, a first state of a crosspoint could correspond to the first nanoscale wire of the crosspoint controlling the second nanoscale wire of the crosspoint, and a second state of the crosspoint could correspond to the first nanoscale wire of the crosspoint not controlling the second nanoscale wire of the crosspoint.

Figure 6:
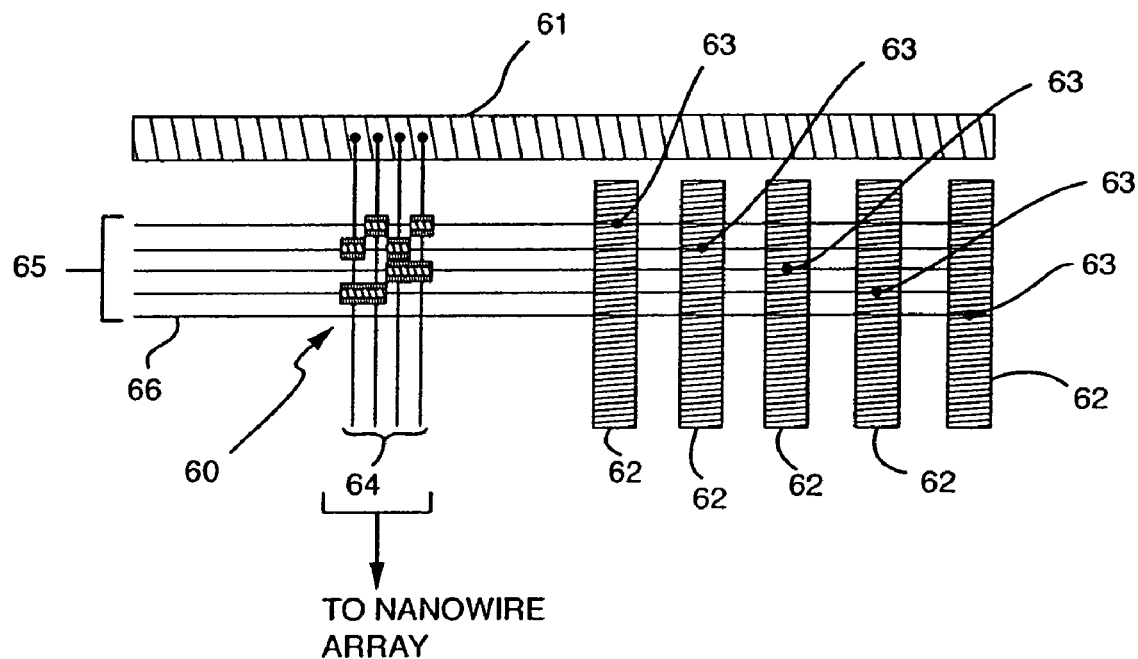
FIG. 6 shows a nanoscale decoder.

The architecture according to the present invention is based on a plurality of array cells. Therefore, power supply gating crossbars acting as decoders will be needed to allow a small number of microscale wires to connect to a larger number of nanoscale wires forming the array grids. In particular, the crossbars will have a set of crossed nanoscale wires. A first set of the nanoscale wires will be connected to a power supply and a second, orthogonal, set of nanoscale wires will control the resistance along the first set of wires. FIG. 6 shows a nanoscale decoder block 60 on the edge of a nanowire array, not shown in the Figure. The decoder has N nanowires 64 (four in the figure) which connect to the nanowire array and 2 $\log_2(N)+1$ nanowires 65 (five in the figure) which connect to an orthogonal set of microscale wires 62 through nanovias 63. The extra control line 66 (the +1 in wires 65) is an enable line used to enable/disable the decoder connection. As usual, black squares in the decoder show OFF positions, allowing a unique address to be assigned to each of the nanoscale wires 64 of the decoder. FIG. 6 also shows a horizontal microscale wire 61 connected to the supply voltage. The microscale wire 61 is a source for the driving voltages in the array, i.e. one of the power supply lines for the circuit.

Figure 7:
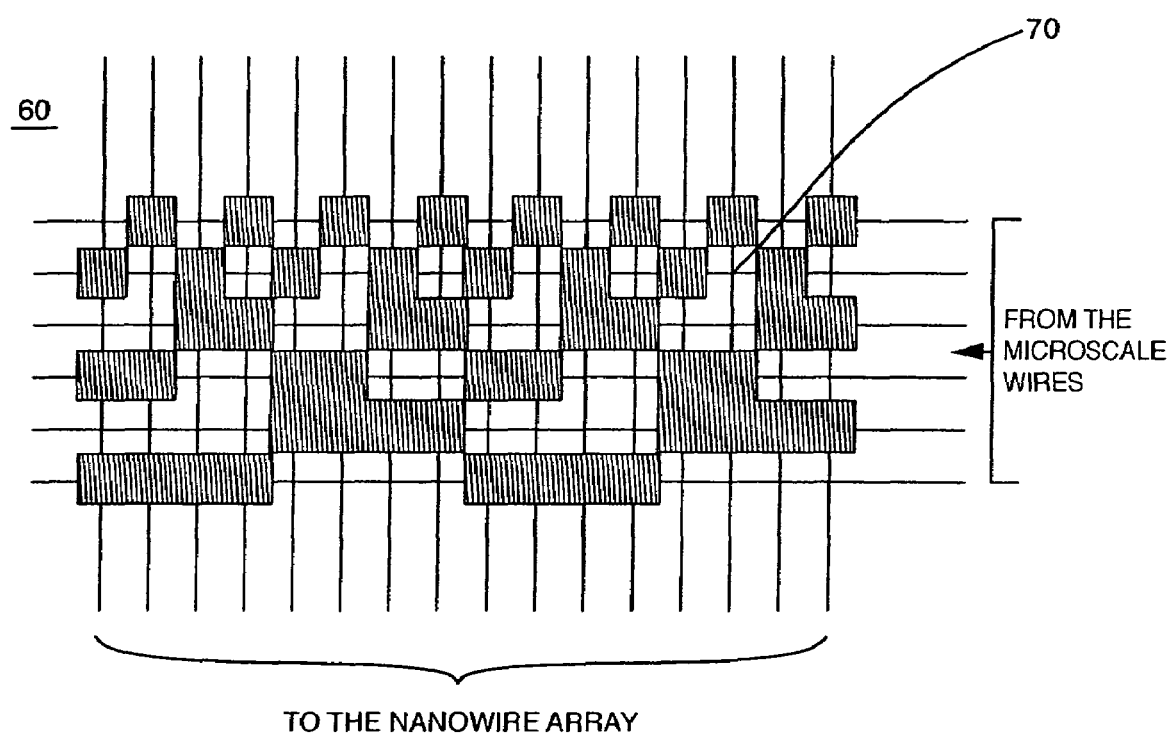
FIG. 7 shows an example of a patterned decoder to be used with the present invention.

However, while address lines which are connected directly to the microscale wires 62 can be driven to a voltage by conventional electronics, it is not possible to drive the nanoscale wires 64 which drive into the nanowire array. To address this, the decoder pattern can be customized during fabrication. An example of this customization in shown in FIG. 7, where a customized decoder 60 is shown, obtained through a stamping process, as disclosed in Stephen Y. Chou, Peter R. Krauss, Wei Zhang, Lingjie Guo, and Lei Zhuang, "Sub-10 nm imprint lithography and applications," Journal of Vacuum Science and Technology B, vol. 15, no. 6, pp. 2897-2904, November-December 1997. In particular, a predetermined pattern of blocks between the orthogonal layers of wires connecting to the nanowire array and to the microscale wires is imprinted. Where the pattern leaves openings, the two layers are allowed to contact, producing a strongly coupled FET arrangement. See, for example, location 70 in FIG. 7. Where the blocks prevent the crossed wires from contacting, the crossed nanowires are far enough apart that they do not control each other. In a preferred embodiment, sparse encoding will be used, i.e. the decoder will be provided with additional encoding lines, in order to guarantee that a faulty address line will still allow proper operation of the decoder or will render only a small fraction of the array unaccessible. For example, a two-hot coding scheme can be considered, where every nanowire 64 is enabled by ANDing together a pair of address wires. Therefore, the patterning of the decoder does not need to be perfect, because it will always be possible, in the preferred embodiment, to tolerate not being able to address a small fraction of the nanoscale wires.

Figure 8:
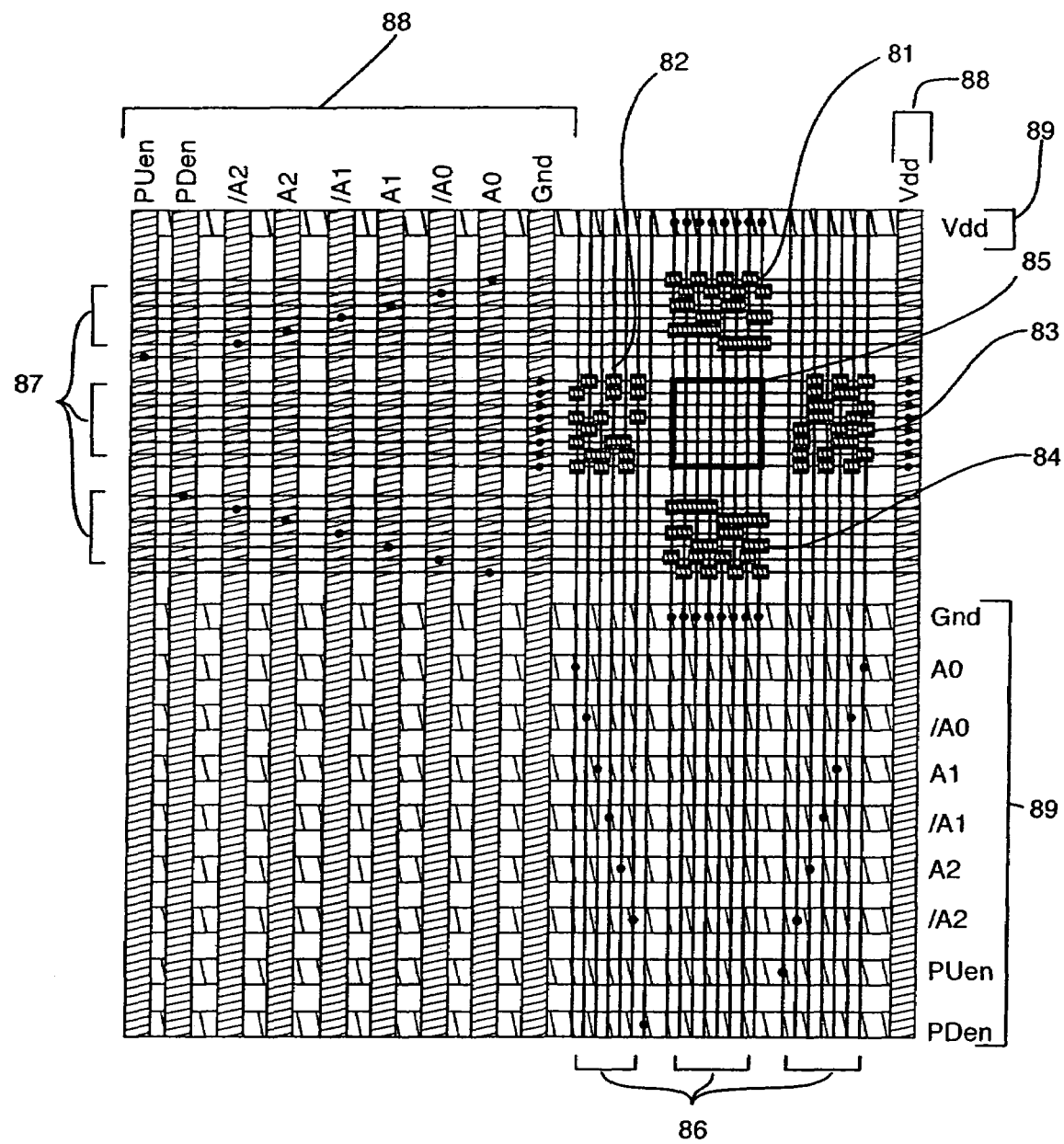
FIG. 8 shows a schematic plan view of nanoscale arrays and encoders arranged in accordance with the present invention.

The decoders are then placed on either side of a nanoscale array, both in a horizontal and a vertical dimension, as shown in the schematic plan view of FIG. 8. FIG. 8 shows decoders 81-84 and an array 85, together with vertical nanowires 86, horizontal nanowires 87, vertical microwires 88, and horizontal microwires 89. The microwires feed the signals PUEN (pull-up enable), PDEN (pull-down enable), /A2, A2, /A1, A1, /A0, A0 (where the symbol /A1 is used to represent the complement of A1) to the decoders 81, 82, 83, and 84. Ground voltage and supply voltage are provided through the lines GND and VDD. Using the decoders 81, 82, 83 and 84 of FIG. 8, it is now possible to drive any single horizontal or vertical nanotube/nanowire to a high or low voltage, and leave the other nanotubes/nanowires floating. For example, a tube can be driven high by driving all of the PFET nanowire crossings in the decoder low (i.e. the pull-up enable PUEN and all the address lines necessary to select this tube). In this way, a low impedance path from the tube to the high voltage supply will be generated. Assuming the pull-down enable PDEN is driven with a high voltage so that it is in high impedance mode, and the true and complement address lines Ai are driven with appropriately opposing voltages, only the selected line is driven and all the other lines are left to float to high-impedance. A tube can be driven low in a similar manner by driving the pull-up enable PUEN high and the pull-down enable PDEN low.

It can be noted that the embodiment of FIG. 8 discloses four decoders for a single array. Alternative embodiments can also provide for the presence of two decoders only, a first decoder on an end of a horizontal run and a second decoder on an end of a vertical run. Decoders should be present on both horizontal and vertical wires in order to allow each crosspoint to be programmed by means of a voltage difference. In particular, in order for a crosspoint to be programmed, both the horizontal and the vertical line associated with that crosspoint will need to be driven. In the embodiment of FIG. 8, decoders are present at both ends of each horizontal or vertical wire run, in order to allow the lines to be pulled both high and low.

Figure 9:
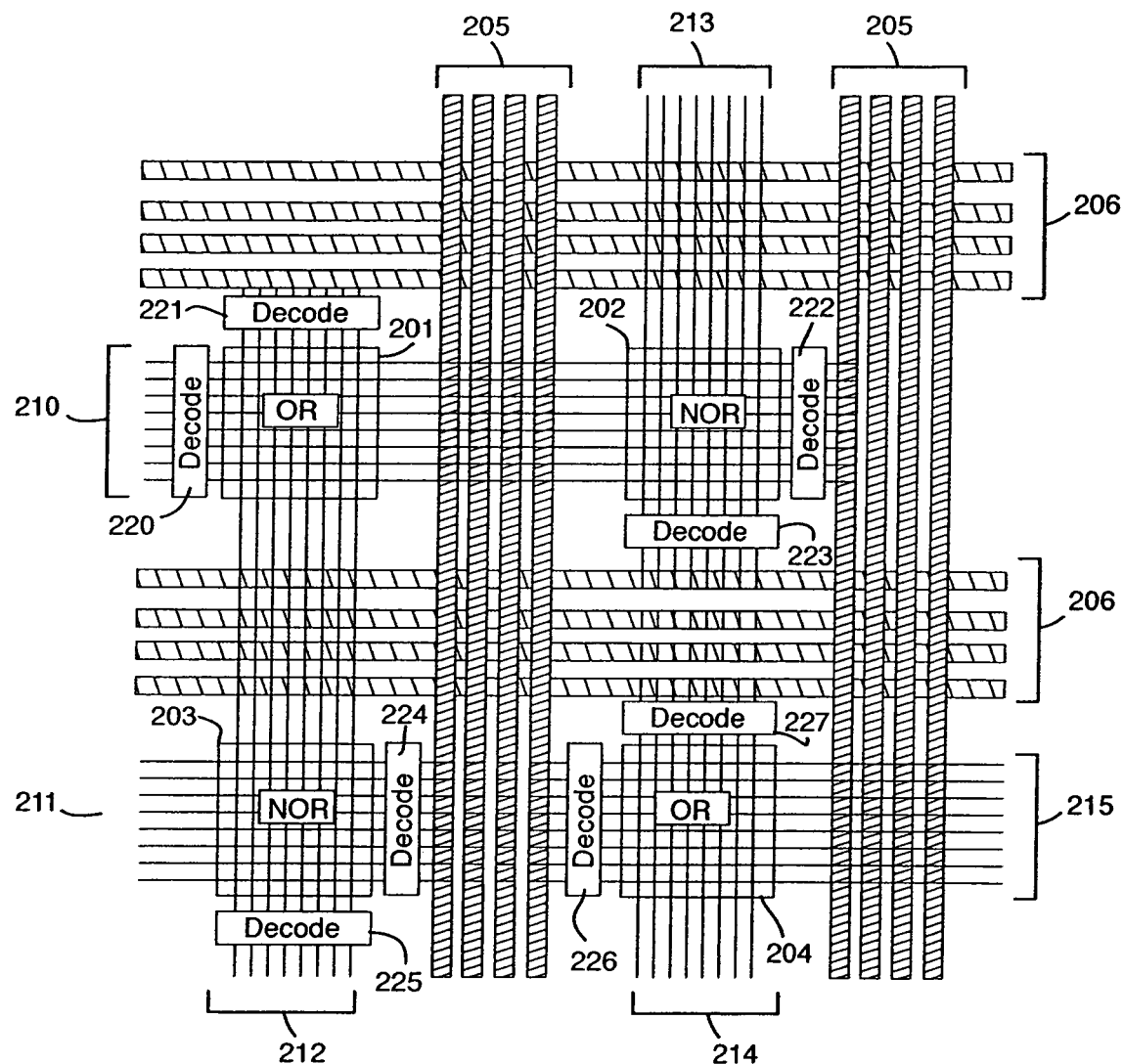
FIG. 9 shows a schematic view of the molecular electronics architecture according to the present invention.

FIG. 9 shows a schematic view of an operational computing system embodying the molecular electronics architecture according to the present invention. The architecture comprises:

1) A plurality of array cells 201, 202, 203, 204. In the example of the Figure, the arrays 201, 204 perform operations under an OR logic, and the arrays 202, 203 perform operations under a NOR logic. The array cells 201-204 are formed by crossed nanowires. For example, the array cell 201 is formed by crossed nanowires 210 and 212; the array cell 202 is formed by crossed nanowires 210 and 213; the array cell 203 is formed by crossed nanowires 211 and 212; and the array cell 204 is formed by crossed nanowires 214 and 215;

2) A plurality of driving devices 220-227 for the array cells 201-204; and

3) A plurality of microscale wires 205, 206 for transmitting input signals to the decoders 220-227 in order to program the crosspoints in the crossbar and to connect or disconnect the array from the logic power supplies.

4) A plurality of nanometer-scale signal restoration elements, like, for example, the NOR circuit shown in FIG. 5. The signal restoration elements restore the output signal of an array, allowing each signal to be correctly used as an input to a further array.

Therefore, according to the present invention, the nanoscale wires are arranged into interconnected, crossed arrays with non-volatile switching devices at their crosspoints. The crossed arrays can function as programmable logic arrays and programmable interconnect, as later explained in more detail.

It should be noted that during normal operation, the driving devices or decoders should not drive the nanoscale wire arrays. Rather, the nanoscale wire arrays will be performing logic of their own. Isolation of an array from a decoder will be obtained by driving both the pull-up enables and pull-down enables high.

Figure 10:
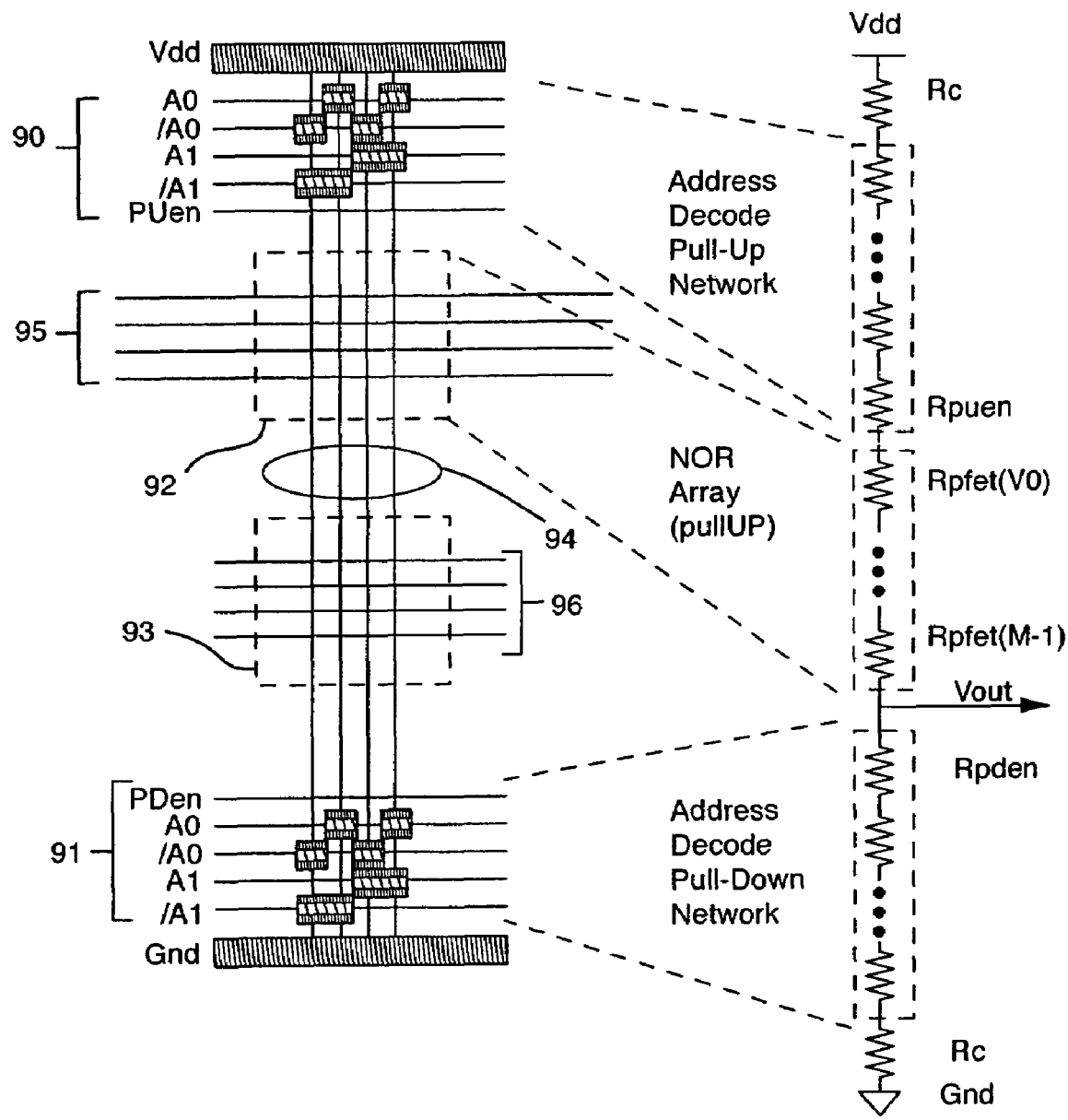
FIG. 10 shows an embodiment of the present invention where the decoders act also as a pull-up/pull-down circuit.

Should the elements of the driving device be made of FET junctions like those shown in FIG. 2, such FETs could serve as a static pull-down/pull-up load (of the type already shown in FIG. 5) during operation, as shown in FIG. 10. FIG. 10 shows a nanoscale arrangement (left side) and its equivalent logical circuit (right side) in the simplified case of a single NOR array 92 made of PFETs. The decoding FETs 90, 91 are placed in series between the contact resistance Rc and the outputs 94 of the array 92. The outputs 94 of the array 92 are indicated as Vout in the electrical right side equivalent. By driving all of the horizontal address lines of the decoding FETs 90, 91 low, the programming FETs of the decoders 90, 91 will act as wires. Additionally, if the pull-up enable PUEN line of decoder 90 is driven low and the pull-down enable PDEN line of decoder 91 is driven with Vpd, the behavior of the circuit becomes substantially similar to the behavior of the NOR pull-up circuit of FIG. 5, with the PDEN FET serving as Rpd. A pull-down behavior will be obtained by driving the pull-up enable PUEN line with Vpd and by driving the pull-down enable PDEN line low.

Therefore, the power supply gating crossbars could act as open circuits, as low resistance devices, as controllable resistance devices, as a static pull-up/pull-down or as a precharge or evaluate gate during operation of the arrays.

As already noted, the output of the array 92 appears on the nanowires 94. To use the information on the nanowires 94 as subsequent input to another stage of logic, a further array 93 can be arranged orthogonal to the array 92. In this way, the input of the array 93 will align with the output of the array 92. The array 93 is orthogonal to the array 92 because the inputs 94 of the array 93 are vertical, and the outputs 96 of the array 93 are horizontal, differently from the array 92, where the inputs 95 are horizontal and the outputs 94 are vertical.

Figure 11:
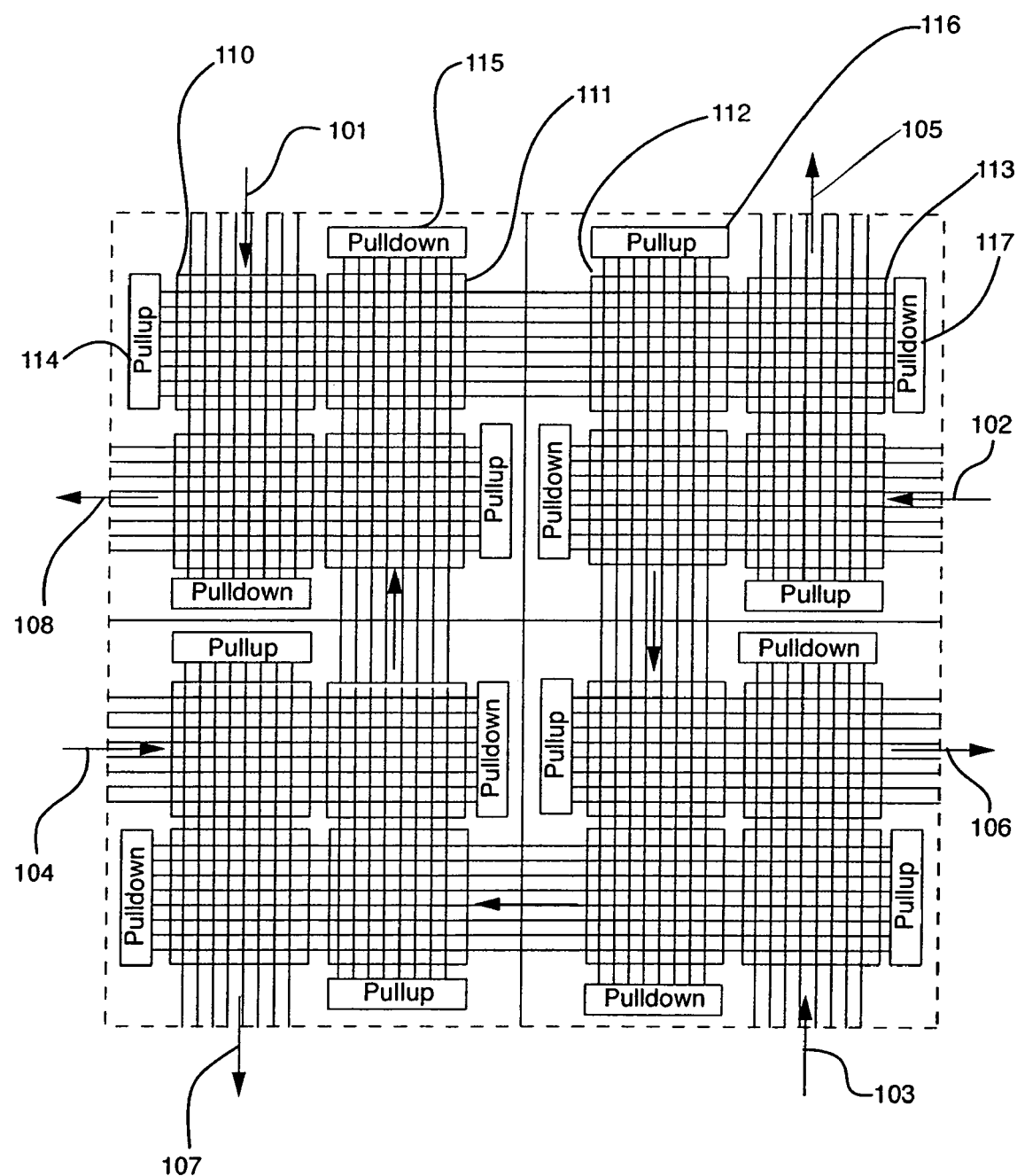
FIG. 11 shows an arrangement of arrays forming a macro tile.

FIG. 11 shows an arrangement of sixteen different arrays forming a 4×(2×2) macro tile. Macro-scale wires have been omitted to simplify the diagram. This arrangement allows inputs to enter from either side of the NOR-plane and outputs to depart in either orthogonal direction. Lines 101, 102, 103, and 104 show inputs to the macro tile. Lines 105, 106, 107, and 108 show outputs from the macro tile. For example, the vertical input signal 101 could be processed by the arrays 110, 111 under control of the decoders 114, 115, then horizontally input to the arrays 112, 113 under control of the decoders 117, 118, and finally output as horizontal output signal 105. The macro tile can be abutted horizontally and vertically to allow arbitrary Manhattan routing within the master array. Manhattan routing is a routing scheme in which connections are made on a rectilinear grid and signals are allowed to make only 90 degree turns at specified intersections.

In more complex configurations, diode-based arrays can be alternated with FET-based arrays. If only the diode-arrays are programmable, imprinting can be used to pattern fixed-connectivity NOR stages to provide both logic and signal restoration, realizing a PAL-like logic structure. Ideally, the FET restoring logic should be programmable after fabrication, so that NOR stages can be first built and then programmed. However, at the present time, it is uncertain whether programmable FET junctions can be obtained. What can be done is that of pairing non-restoring stages (e.g. diode stages) with restoring stages (e.g. FET stages). In this case, the whole device can be programmable even if the restoring stage itself is not programmable. In order to allow this embodiment to work properly, care must be taken in ensuring that the restoring stage can tolerate the signal loss associated with the non-restoring stage or stages and produce a restored signal which can properly drive the next non-restoring stage. For example, a restoring inverter stage could be placed between non-restoring programmable stages. Alternatively, the restoring stage may perform logic as well (e.g. NOR). Programmable devices which alternate a programmable stage followed by a non-programmable stage are well known in VLSI (e.g. PALs, which comprise a programmable OR plane followed by a fixed AND plane). Therefore, a structure with a non-restoring, programmable diode OR plane followed by a restoring, non-programmable FET NOR plane can be adopted. The non-programmable FET NOR can be defined during fabrication using similar techniques as used for the decoder (e.g. stamping).

According to the present invention, signal polarity control is obtained through arrangement of array inversions. For example, the NOR arrangement shown in FIG. 5 could be rotated upside-down, so that the static load (or precharge) Vpd is on top, the output in the middle, and the programmable crossbar inputs IN0 . . . INM-1 are on the bottom, connecting the output to the low power supply, so that the function performed would be an OR instead of a NOR. Using a routing like the one shown in FIG. 11, a vertical composition can be obtained such that the array above the current array is a NOR array and the array below the current array is an OR array, so that the output of the current array can follow either an OR or a NOR logic. Therefore, if the outputs of the OR and NOR arrays can be routed back to the same array (for example the same starting array), then inversion of signals can be selectively controlled by choosing to route through the top (NOR) or bottom (OR) connected array.

When assembled into arrays, some of the nanoscale wires could have poor or non existent contacts, and individual switches might be non-functional. The architecture according to the present invention is designed to tolerate these defects by both local wire sparing and array sparing, where some of the arrays will be designated as spares. There is no logical significance to which wire is used to collect the output of a logical OR or NOR function. As long as the wires fabricated in the array are more than the wires actually needed, the faulty wires and switches can be avoided and logical operations can be performed on the functional wires. The base array size and the level of sparing included in the array are picked based on the specific defect rate expected at any point in time, similarly to the way spare rows and columns are designed in conventional DRAM memories. If the number of faulty components in some arrays or decoders exceeds the designed level of sparing, those arrays can be discarded. Multiple independent paths through different arrays in the design allow complete routing around faulty arrays.

Figure 12:
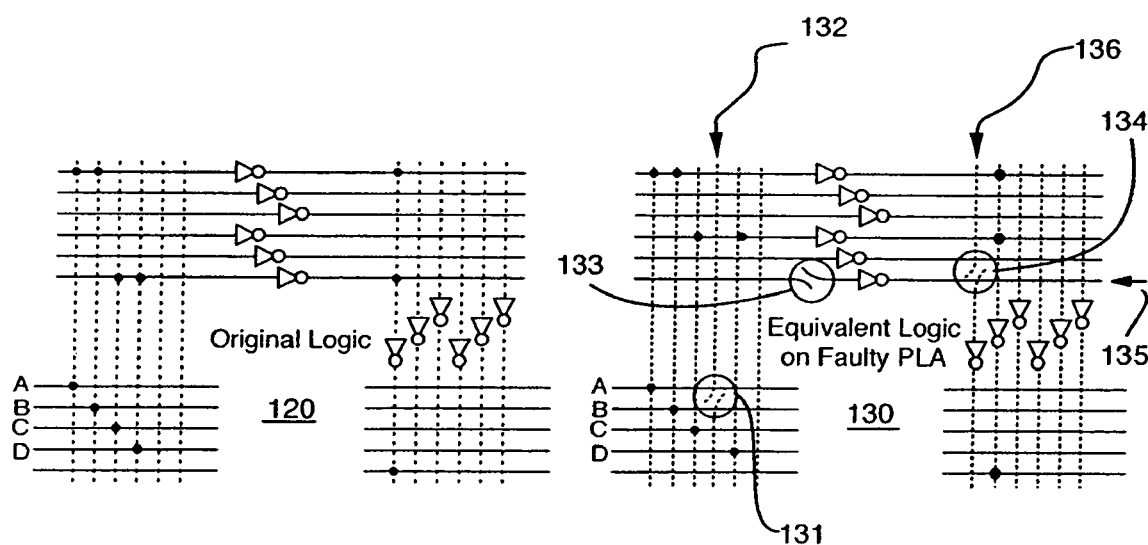
FIG. 12 shows how fabrication of additional wires in the array can avoid problems due to faulty wires and switches.

FIG. 12 shows, for example, how fabrication of additional wires in the array can avoid problems due to faulty wires and switches. In FIG. 12, numeral 120 shows a PLA in original logic, while numeral 130 shows an equivalent PLA with a faulty input 131 along line 132 and faulty inverter connections 133, 134 along lines 135, 136.

While several illustrative embodiments of the invention have been shown and described in the above description, numerous variations and alternative embodiments will occur to those skilled in the art. Such variations and alternative embodiments are contemplated, and can be made without departing from the scope of the invention as defined in the appended claims.

What is claimed is:

1. A circuit comprising:
   a plurality of arrays having first and second sets of address lines and connections between the first and second sets of address lines; and
   a plurality of driving devices for the plurality of arrays, the driving devices having third and fourth sets of address lines and connections between the third and fourth sets of address lines,
   wherein the second set of address lines is connected with the fourth set of address lines,
   wherein the driving devices have a first condition in which they act as decoders for the arrays, and a second condition in which they act as signal restoring devices for the arrays, and wherein the driving devices comprise nanoscale driving devices.

2. A circuit comprising:
   a plurality of arrays having first and second sets of address lines and connections between the first and second sets of address lines; and
   a plurality of driving devices for the plurality of arrays, the driving devices having third and fourth sets of address lines and connections between the third and fourth sets of address lines,
   wherein the second set of address lines is connected with the fourth set of address lines,
   wherein the driving devices have a first condition in which they act as decoders for the arrays, and a second condition in which they act as signal restoring devices for the arrays,
   wherein the driving devices comprise power supply gating crossbars, and wherein the power supply gating crossbars comprise crossed nanoscale wires.

3. A method of driving a plurality of arrays having first and second sets of address lines and connections between the first and second sets of address lines, the method comprising:
   providing a plurality of driving devices for the plurality of arrays, the driving devices having third and fourth sets of address lines and connections between the third and fourth sets of address lines, the second set of address lines being connected with the fourth set of address lines, the driving devices having a first condition in which the driving devices act as decoders for the arrays, and a second condition in which the driving devices act as signal restoring devices for the arrays, wherein the driving devices comprise nanoscale driving devices.

4. A method of driving a plurality of arrays having first and second sets of address lines and connections between the first and second sets of address lines, the method comprising:
   providing a plurality of driving devices for the plurality of arrays, the driving devices having third and fourth sets of address lines and connections between the third and fourth sets of address lines, the second set of address lines being connected with the fourth set of address lines, the driving devices having a first condition in which the driving devices act as decoders for the arrays, and a second condition in which the driving devices act as signal restoring devices for the arrays, wherein the driving devices comprise power supply gating crossbars and wherein the power supply gating crossbars comprise crossed nanoscale wires.

\* \* \* \* \*